(12) United States Patent
Thompson et al.

(10) Patent No.: US 6,701,835 B2
(45) Date of Patent: Mar. 9, 2004

(54) METHOD FOR PLACING INDICIA ON SUBSTRATES

(75) Inventors: Travis W. Thompson, Perrysburg, OH (US); Geoffrey D. Charles, Gibsonburg, OH (US)

(73) Assignee: Pilkington North America, Inc., Toledo, OH (US)

( * ) Notice: Subject to any disclaimer, the term of this patent is extended or adjusted under 35 U.S.C. 154(b) by 0 days.

(21) Appl. No.: 09/918,731

(22) Filed: Jul. 31, 2001

(65) Prior Publication Data

US 2003/0029336 A1 Feb. 13, 2003

(51) Int. Cl.$^7$ ............................................... B41F 17/00
(52) U.S. Cl. .......................................................... 101/42
(58) Field of Search .................... 101/42, 44; 347/6

(56) References Cited

U.S. PATENT DOCUMENTS

| 4,485,387 A | * | 11/1984 | Drumheller ............ 346/140.1 |
| 4,661,368 A | | 4/1987 | Rohde ........................ 427/8 |
| 4,664,945 A | | 5/1987 | Maeda et al. ................ 427/96 |
| 4,692,351 A | | 9/1987 | Maeda et al. ................ 427/96 |
| 5,091,003 A | | 2/1992 | Boaz ........................ 106/20 |
| 5,616,173 A | * | 4/1997 | Okamoto et al. ........... 106/117 |
| 6,277,517 B1 | * | 8/2001 | Thomas et al. ............ 429/175 |

* cited by examiner

*Primary Examiner*—Judy Nguyen
*Assistant Examiner*—Alfred E. Dudding
(74) *Attorney, Agent, or Firm*—Marshall & Melhorn, LLC.

(57) ABSTRACT

A method for producing precise, complex patterns on a glass or plastic substrate using a writing system capable of dispensing high viscosity materials at a volume rate synchronous with the rate of movement of a flexural member relative to said substrate, is disclosed.

10 Claims, 9 Drawing Sheets

METHOD FOR PLACING INDICIA ON
SUBSTRATES

FIELD OF THE INVENTION

The present invention relates to a method of printing thick film patterns on a glass or plastic substrate.

BACKGROUND OF THE INVENTION

Currently, patterns on substrates such as automotive windshields and back lights are formed, primarily, by screen printing processes. The limitations of the screen printing process such as variable uniformity in line thickness, inability to print lines thinner than 0.025 mm, and narrower than 0.25 mm with currently available screen fabric, are well known. Screen printing is also an expensive process, not only in terms of the manufacture of the silk screens themselves, but also the complicated nature of the process of changing from one screen to another in the printing process.

Accordingly, it would be desirable to have available a method of printing very precise patterns on glass or plastic substrates which is cost effective and gives consistent results. Additionally, it would be desirable if such a system would be capable of changing printing inks and patterns relatively simply and in a short period of time.

Those skilled in the art of printing on glass and polycarbonate substrates have continued in their attempts to develop systems which can produce very precise patterns in a repeatable and cost effective fashion on large glass and polycarbonate substrates such as automotive windshields and back lights.

U.S. Pat. No. 4,692,351 describes a drawing apparatus comprising a drawing nozzle having a discharge hole for a paste, X-Y drive means for moving the drawing nozzle, and a substrate for drawing a thick film circuit on the substrate, up and down drive means for relatively moving the drawing nozzle and the substrate in directions perpendicular to the substrate, and control means for controlling the discharge rate of paste from the discharge hole and for controlling the X-Y drive means, as well as, the up and down drive means. The discharge amount of the paste from the discharge nozzle is controlled in accordance with the relative moving speed between the drawing nozzle and substrate. Furthermore, a drawing apparatus is also arranged to detect the relative speed of movement between the drawing nozzle and substrate and to control the discharge rate of paste from the discharge hole in accordance with the detected relative speed of movement. The up and down drive or nozzle lifter comprising a magnet is attached to the upper supporting plate.

U.S. Pat. No. 4,664,945 describes a method of forming thick film circuits comprising laterally moving a writing head containing a paste for forming a thick film circuit relative to a board on which the circuit is to be formed. The writing head is maintained in close proximity to the board, extruding the paste from an extrusion means connected to the writing head by supplying pressure from a source of compressed air to the extrusion means, thereby, depositing the paste on a top surface of the board.

U.S. Pat. No. 4,661,368 describes a method of depositing a dose of flowable material from a tip onto a surface comprising the steps of advancing the tip toward and into engagement with a portion of a surface in sensing a reactive force on the tip from the surface, recording a position on a path of advancing the tip when a particular value of the sensed reactive force is attained. Halting the advancement of the tip when a desired position has been attained and retracting the tip away from the surface and depositing a dose of flowable material onto the desired portion of the surface.

U.S. Pat. No. 5,091,003 discloses a method of printing on glass utilizing a non-contact ink jet printer and a specialized ink composition comprising a mixture of silver nitrate and a carrier of said ink having a low viscosity compared to those normally utilized in a non-contact ink jet printer.

SUMMARY OF THE INVENTION

The present invention relates to the use of an orifice printing system, wherein inks are dispensed through a writing orifice, to print thick film patterns on a glass or plastic substrate.

The invention is particularly directed to the use of an orifice printing system for printing a pattern on an automotive glazing such as a windshield or back light. More particularly, it is directed to printing very precise patterns on glass or polycarbonate substrates, which patterns may be formed from electrically conductive materials, thus enabling such patterns to conduct electrical current. Such patterns may then serve as devices for defogging or defrosting the glazing, and also as antennas for various purposes, such as radio, telephone, and the like.

An orifice writing system such as that disclosed in U.S. Pat. No. 4,485,387, which is hereby incorporated by reference, is particularly well-suited for use in the present invention, as it can produce lines of very precise and uniform width, uniform cross sectional area, and clean start and termination of such lines. These characteristics can be maintained at a variety of printing speeds over large areas and with greater repeatability than with screen printing methods currently in use. The appearance of the patterns thus produced is enhanced. If electrically conductive printing materials are used, the performance for conducting electrical current in terms of milli-ohms/square is substantially enhanced. A further advantage of such an orifice writing system is that the source of the printing ink can be changed in a matter of minutes and a pattern to be written by the system can be changed via microprocessor in minutes, as well.

Heretofore, such orifice printing systems have been used primarily for printing very precisely but on a small scale, such as for electronic circuit boards and the like. The inks utilized in such systems have been relatively low viscosity inks. It is desirable in connection with the present invention, to utilize much more viscous inks than have been used in previous applications of orifice writing systems. The higher viscosity needed is on the order of 400% greater than has been used previously. Stated another way, the viscosity preferred for purposes of the subject invention is in the range of 50,000–190,000 pascal seconds.

BRIEF DESCRIPTION OF THE DRAWINGS

The above, as well as other advantages of the present invention, will become readily apparent to those skilled in the art from the following detailed description of a preferred embodiment when considered in light of the accompanying drawings in which.

DESCRIPTION OF THE PREFERRED EMBODIMENT

In accordance with the present invention, an orifice writing system is used in the method of the invention to place indicia on a glass or polycarbonate substrate. It has been discovered that indicia in the form of very complex, but highly precise patterns may be temporarily or permanently affixed to glass or polycarbonate substrates by a method or process comprising providing a glass or polycarbonate substrate including a first major surface; applying to the glass or polycarbonate substrate in a predetermined pattern with a flexurally supported orifice writing system, an ink composition of a known, high viscosity, which may contain inorganic pigments and/or powdered metals; feeding such high viscosity ink at a precisely controlled rate through said orifice such that the viscous forces of said material flowing through said orifice determine the vertical displacement of the flexurally supported member in relation to said substrate; and heating, if desired, the substrate having the ink affixed thereto to a temperature, and for a time sufficient to cause the pigment and/or metallic powder to become permanently affixed to the glass or polycarbonate substrate.

The process for permanently affixing indicia to the glass or polycarbonate substrate is particularly useful for placing lines or grids on a glass or polycarbonate substrate, which may be utilized for antennas (radio, phone, etc.), defogging or defrosting, global positioning systems, sensor pads, alarm systems, and the like.

Figure 4:
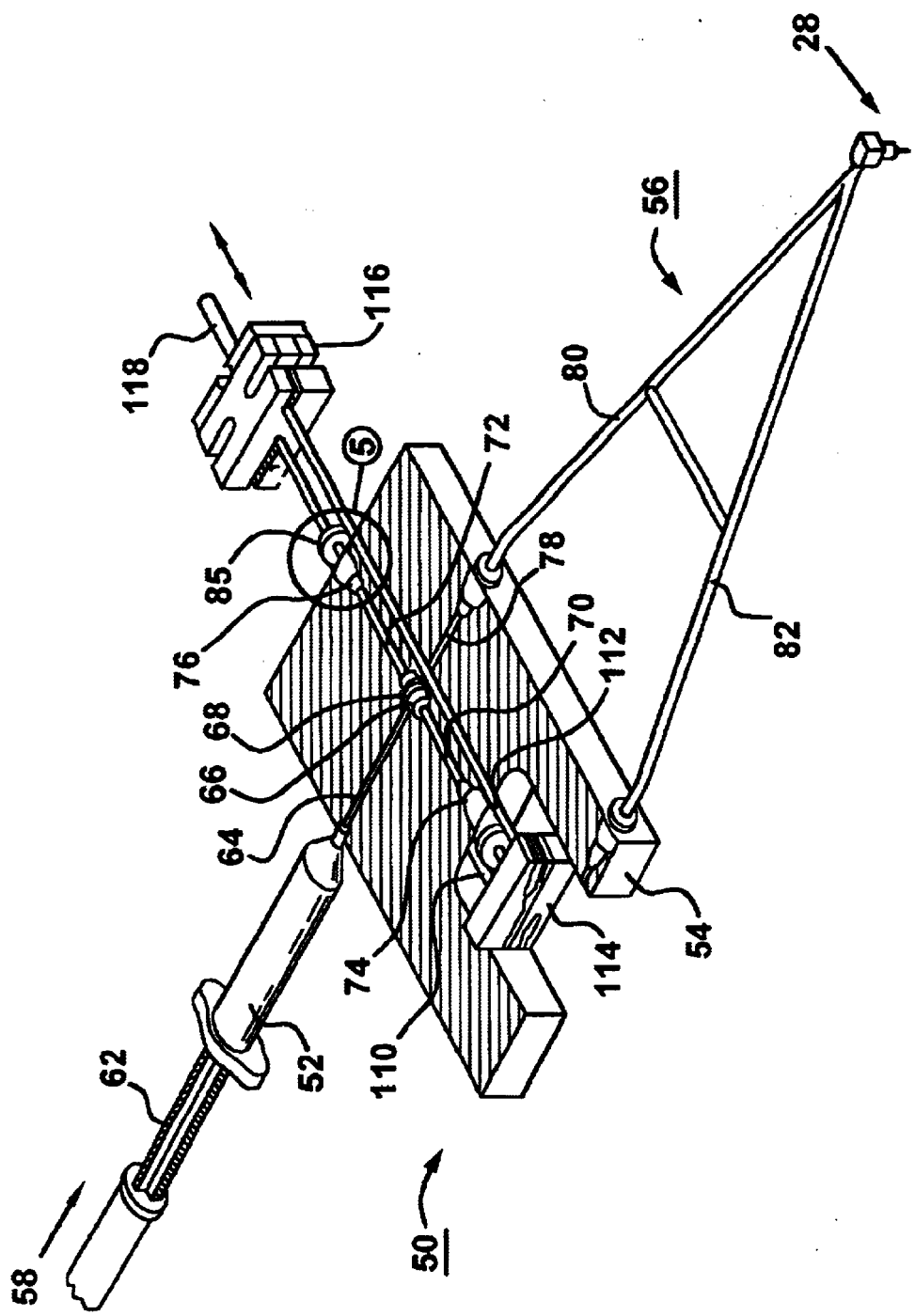

Details of the structure and operation of the preferred orifice printing system may be found in U.S. Pat. No. 4,485,387. In a preferred embodiment, the orifice writing system operates as follows:

The pen 28 is part of an interchangeable pen-pump assembly 50 (See FIG. 4). Several assemblies, which contain a syringe 52, a positive displacement pump mechanism in a pump block 54, the pen tip 28 and a flexural, A-frame support 56 for the pen tip, are pro-vided. The pen tips may be ceramic, metal or plastic and have orifices of various size to change the line width when the pen tip is changed. The ink supply is from the syringe 52. The syringe of each interchangeable assembly 50 may be loaded with a different ink material. For example, conductive, dielectric and resistive inks may be loaded into the syringes of the various pen assemblies. Different assemblies may be used for inks having different resistivities. Inks can be changed readily by interchanging the pen assemblies 50.

The syringes 52 are desirably loaded with ink under vacuum conditions to avoid the inclusions of air or other gas in the ink material. Inasmuch as the syringes 52 are airtight, the pen assemblies 50 can be stored in a loaded condition for long periods of time without affecting inking quality.

A pneumatic piston 58 provides constant force via a coupling 60 to the plunger 62 of the syringe 52. The pump block 54 contains a double acting pump mechanism. A passage 64 from the syringe goes to a central valve opening 66 (See FIG. 4). A cylindrical valve body 68 in the opening 66 provides a four-way valve which alternately directs the ink supply to different pump volumes 70 and 72 defined in a bore 84 (See FIG. 4). The double acting pump has two rams 74 and 76 which displace the pump volumes alternately to pump ink through an outlet passage 78. The outlet passage 78 is in communication with a tube 80 which has a conduit for ink delivery to the pen 28. The other tube 82 of the A-frame 56 provides added flexural support for the pen 28.

As shown in FIG. 4 the pump block 54 has bores above and below the central level of the block in which the passages 64 and 78 and the pump volumes 70 and 72 are disposed. Rods 110 and 112 are located in these bores. These rods 110 and 112 join the two double acting rams 74 and 76 together through coupling blocks 114 and 116 so that they act in concert as a double acting pump. A single drive rod 118 is used to drive both rams via the couplings 116 and 114 and the tie rods 110 and 112. The coupling 116 may have a quick disconnect so that the assembly 50 can be interchanged with like assemblies carrying different inks.

The valve 68 has two positions 90 degrees apart so that the syringe fills one of the volumes 70 and 72 while one of the rams 74 or 76 is pumping ink out of the other volume to the pen.

During inking, one side of the double acting pump is pumping ink hydraulically from one pump volume, while the other pump volume is being refilled pneumatically. As noted above, ink is delivered to the pen 28 through the pen support tube 80 by positive displacement of the small, closed ink volume. As will be described more fully below this positive displacement is in synchronism with the pen movement relative to the substrate movement and thus with the tangential writing speed of the pen 28.

Figure 2:
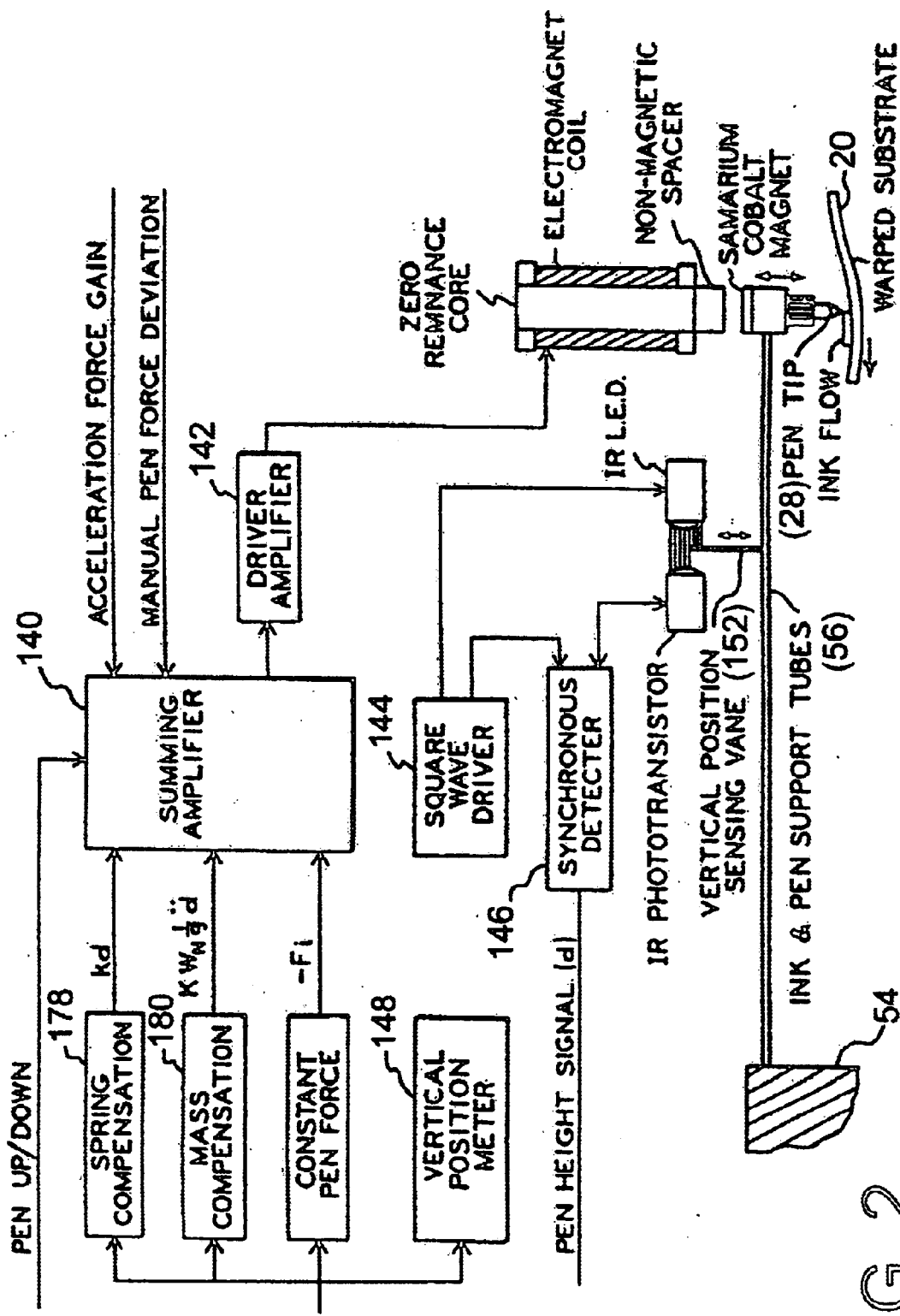
FIG. 2 is a block diagram showing the pen used in the system shown in FIG. 1, as well as components thereof which provide for dynamic pen control based on sensing ink flow through the orifice at the pen tip.

Referring to FIG. 2 there is shown the pen with its pen tip 28 supported by the flexural support provided by the ink and pen support tubes 56. The pen is lifted and depressed with respect to the substrate 20 by a electromagnetic coil or solenoid on a core which is of low and preferably zero remnance. This core may be highly purified iron or suitable ferrite ceramic material. The actuation force is applied against a high coercivity magnetic material suitably a samarium cobalt magnet which opposes a non-magnetic spacer at the lower end of the core. A control signal from the microprocessor generates a pen up/down command to a summing amplifier 140 which drives the electromagnet coil through a driver amplifier 142. When the pen up signal is asserted, the energizing current in the coil is increased and the magnet attracted to lift the pen up from the substrate. The magnet is lifted into contact with the spacer. Upon pen down command the current in the coil is reduced gradually to allow the pen tip to descend slowly for a soft landing on the substrate. Then the appropriate inputs are applied to the summing amplifier 140 to establish the necessary magnetic force on the pen tip for dynamic pen control.

A square wave driver 144 and a synchronous detector 146 are used much in the same manner as in linear analogue optical switches to provide the pen height signal (d). This pen height signal (d) is therefore an analogue signal the amplitude of which is directly proportional to the vertical displacement of the pen tip. Other displacement sensors, for example with Hall effect devices may be used. The electro-optical sensor is, however, preferred.

A vertical position meter 148, suitably a zero center meter, calibrated to zero at the center of the dynamic range of the sensor system (including the driver 142, detector and photo transistor, LED arrangement). The meter thus enables visual monitoring of the vertical position of the pen tip with respect to the center of the dynamic range. A microscope therefore need not be used in the setup adjustments of the writing system.

Figure 1:
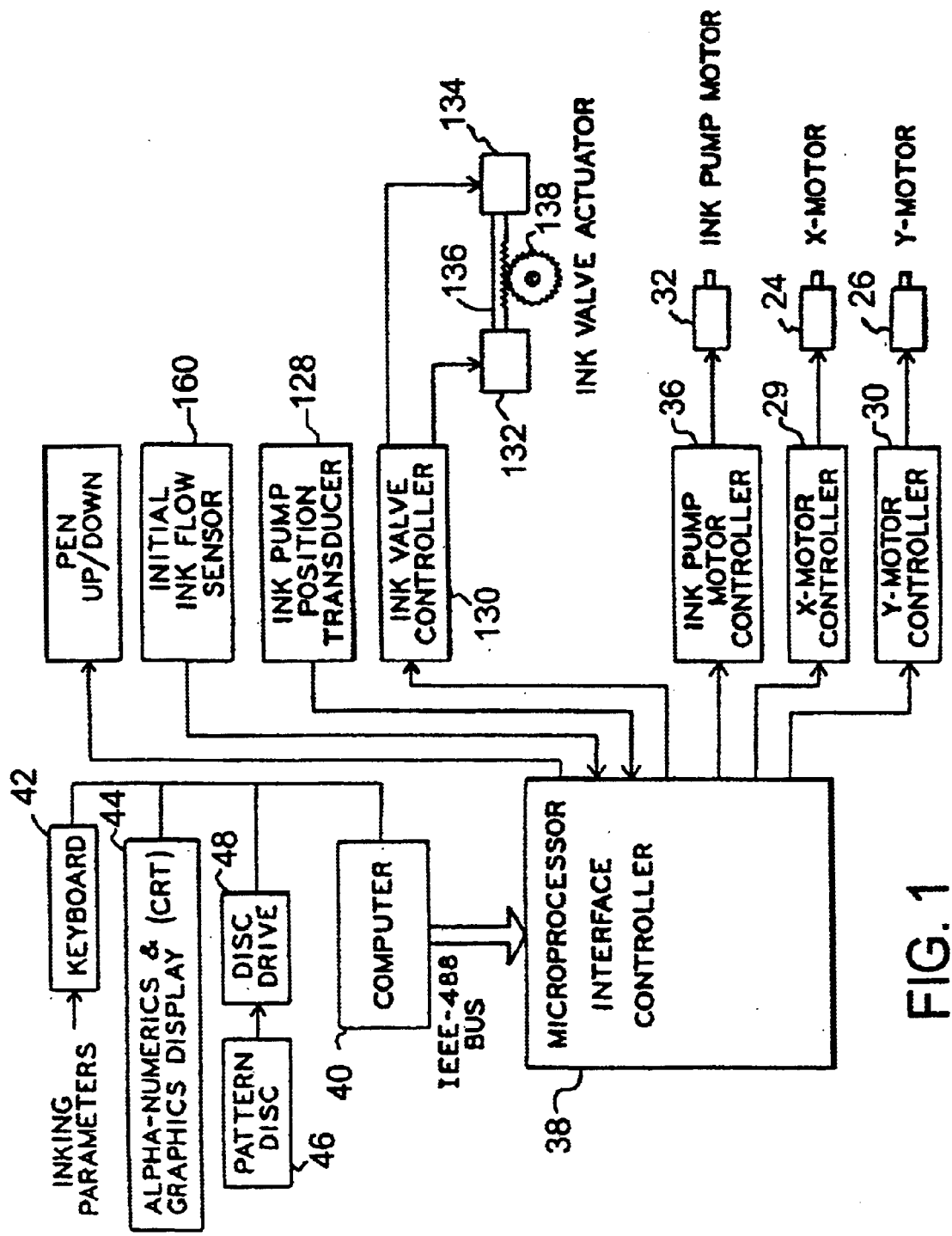
FIG. 1 is a block diagram of a printing system useful in accordance with the method of the invention showing the major portions of the system concerned with synchronous positive displacement ink feed through the writing orifice of the pen used in the system.

FIG. 1 shows the motor controller 29 for the x motor controller 30 for the y motor 26. Also shown is an ink pump motor 32 which is controlled by an ink pump motor controller 36. The motor controllers 29, 30, and 36 translate command pulses generated by a microprocessor interface controller 38 into signals which drive the motors. The number of pulses determines the displacement produced by the motors and the pulse rate determines the velocity of that displacement. The motors may be rotary motors with screw drives or other gearing to translate the rotary motion to linear motion. Linear motors may also be used.

A computer 40 determines the pen path topology for the pattern which may consist of rectangles, paths, triangles and arcs for any chosen pen width. The computer data is transferred by way of a data bus to the controller 38. The computer is equipped with a keyboard 42 into which the operator can input the inking parameters, such as the cross-sectional areas on the lines which are to be written and the writing speed of the pen. Circuit development can be accomplished through the use of the keyboard together with other input devices such as a digitizer/tablet. The pattern may be displayed together with other information concerning inking parameters in alpha-numeric form on a graphics display such as a cathode-ray tube display 44. A printer with graphics display capability and a plotter may also be tied to the computer as peripheral devices. The pattern of the circuit may be created in the computer aided design operation of the system and stored on a disk or other storage medium 46. A floppy disk storage system using a disk drive 48 may suitably be connected to the computer 40 as a peripheral device for reading and writing on the disks.

As shown in FIG. 1, the transducer 128 provides an output to the microprocessor interface controller 38 indicating the position (displacement) of the pump. The microprocessor interface has stored therein data representing the total line length and ink volume necessary to complete writing the next anticipated line in the pattern. If the position transducer indicates that the remaining displacement volume is insufficient to complete the next anticipated line of the pattern, an output is provided to a controller 130 (see FIG. 1) from the microprocessor interface controller. This controller outputs drive current to an ink valve actuator 132 utilizing opposed solenoids 132 and 134 which reciprocate a rack 136 to drive a spur 138 90° so as to turn the valve body 68. Accordingly, when the double acting pump is reversed by signals applied to the ink pump motor 32 via the ink pump motor controller 36, the ink will be pumped from the recharged pump volume and the previously used pump volume will be placed in communication with the syringe for recharging. Other actuators may be used for the ink valve, such as pneumatically controlled cylinders.

Figure 5:
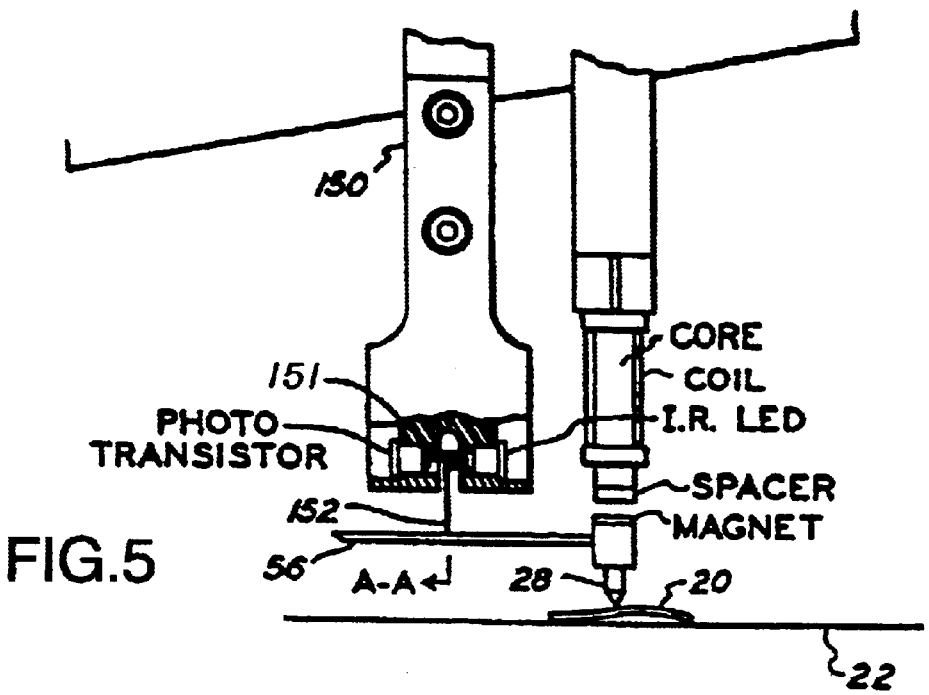
FIGS. 5–7 are a partial elevational and schematic views, respectively, of the pen, its lift mechanism and the electrical optical mechanism associated therewith for sensing the vertical displacement of the pen with respect to a substrate.
Figure 6:
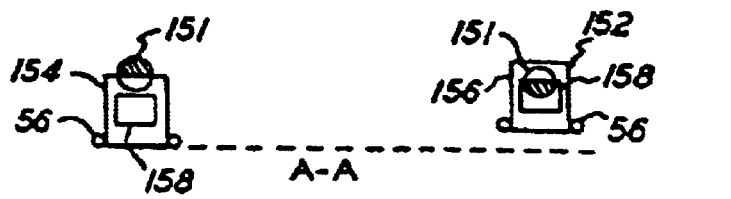
Figure 7:
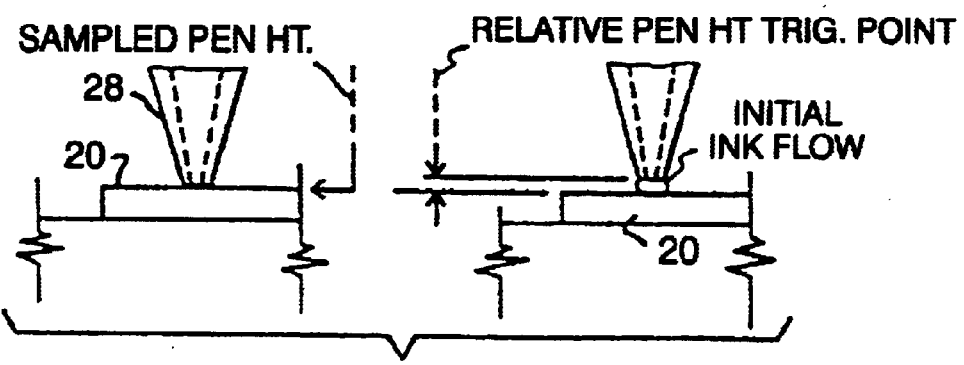
Figure 13:
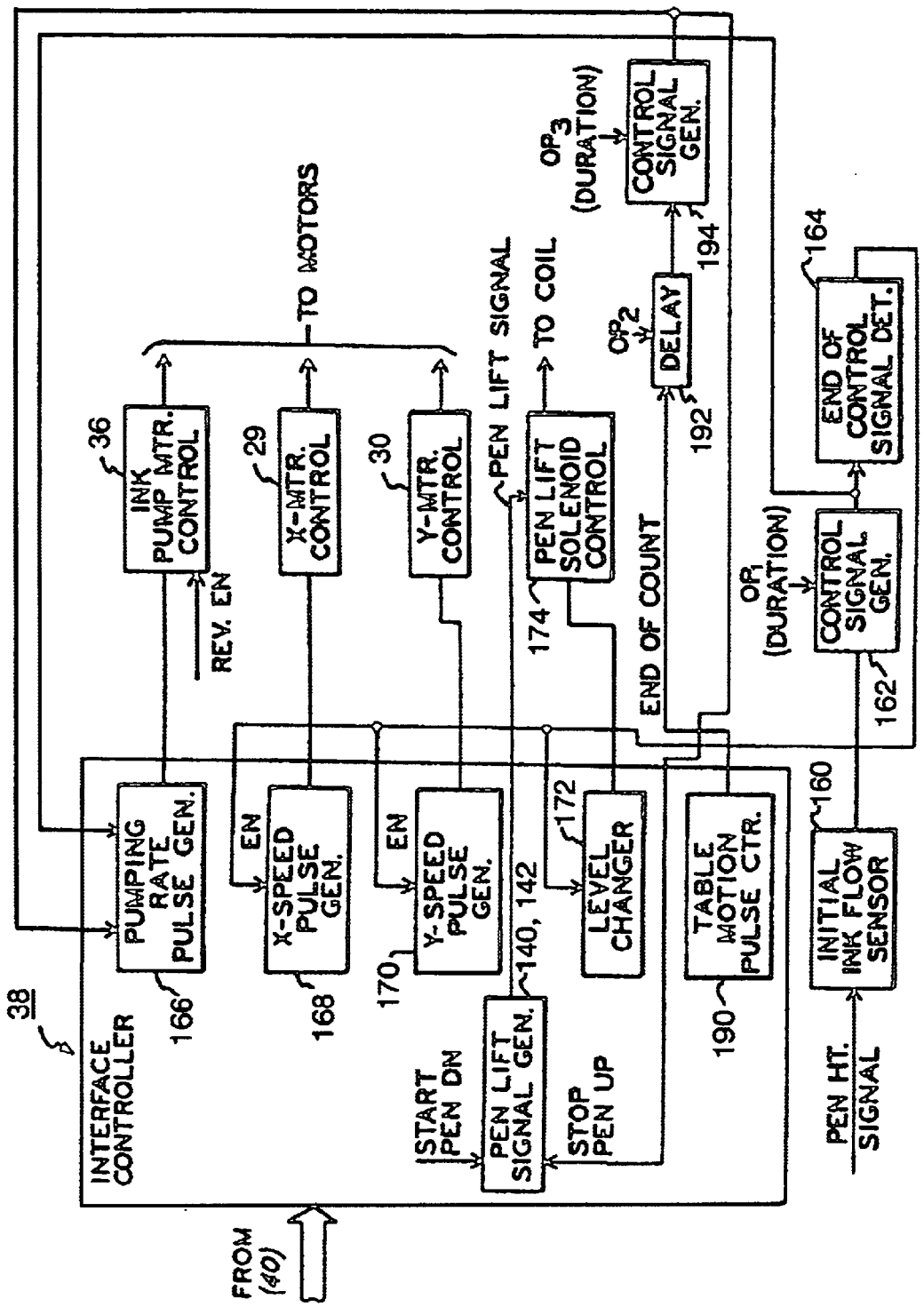
FIGS. 13 and 14 are a block diagram and signal traces, respectively, illustrating the electrical controls of the writing system.
Figure 14:
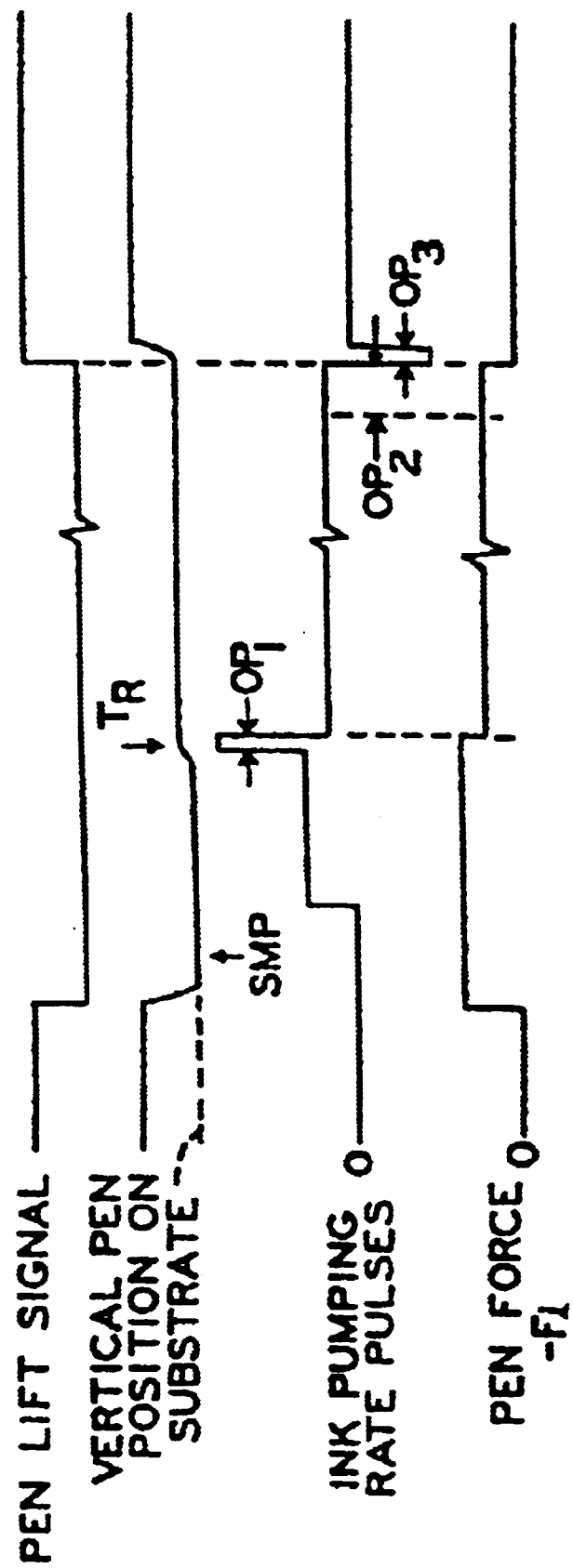

The flow of ink is started by the application of the pulses which control the ink pumping through the ink pump motor controller 36 (FIG. 1). Pumping of ink is initiated at a pre-pen lift pumping rate which may be different from the pumping rate used during inking of the line which is commanded by the computer 40 so as to maintain uniformity of cross-section of line at different writing speeds. Referring to FIGS. 5 and 6, it will be seen that the sensor is mounted in a bracket 150 closely adjacent to the electromagnet coil. The vane 152 is shown mounted on the pen support tubes 56 in a first position at 154 where it is in writing relationship with the substrate and in a second position a 156 where it is lifted to the pen up position; the magnet being in contact with the nonmagnetic spacer, as is the condition during loading new substrates and entering of data into the computer. The vane 152 has an aperture 158. It will be noted that in the writing position at 154, the beam 151 of illumination is partially blocked by the vane. Also in the up position as shown at 156 the bean 151 is also partially blocked, even though the optical sensor is not being used when the pen is in the pen up position. The passage of illumination through the aperture 158 in the pen up position maintains continuity of illuminating energy on the junction of the photo transistor. The temperature of the junction that is maintained and thermal drift errors in the pen height signal at the beginning of inking when the pen is brought down towards the substrate are minimized. As previously shown pen tip 28 may write on substrate 20, which, in turn, is in contact with translator table 22. As the ink begins to flow, the viscous forces of the extruding ink, as shown in FIG. 7 causes the pen 28 to rise. The pen height signal, which represents the vertical pen position, increases. When that signal reaches a preset level relative to the level at the sampling time, SMP, information is obtained for starting the pen motion and also for increasing the pressure to provide immediate compensation for the stores energy compression in the ink. Functionally, the ink flow sensor 160 (FIG. 13) provides an output when 60 the relative amplitude of the vertical displacement signal reaches, the threshold level to trigger a control signal generator 162. The trigger point, TR, is indicated in FIG. 14 on the vertical pen position diagram.

Referring again to FIG. 13, the control signal generator generates a pulse, the duration of which may be set under operator control (the operator providing a control signal $OP_1$). This control signal is applied to a pumping rate pulse generator 166 in the interface controller 38 which then increases the pulse rate to the ink pump motor controller 36. The end of the control signal pulse is then detected by an end of control signal detector 164 which responds to the lagging edge of the control pulse. This end of control signal enables the generators 168 and 170 which generate the speed control pulses for the x motor and y motor controllers 28 and 30. The pen motion pulses which activate these controllers 28 and 30 then start as shown in FIG. 14. Referring back to FIG. 13, a level changer 172 is enabled to apply the pen force signal to the pen lift solenoid controller 174. This solenoid controller is provided by circuits in the summing amplifier 140 and by the driver amplifier 142. This enables the pen force signal as inputted from the computer to be applied to the electromagnet coil. This pen force signal plays a part in the dynamic control of the vertical displacement of the pen. Inasmuch as an appropriate pumping rate is selected at line start to overcome ink compression, the line which is written is uniform at line start as well as throughout the writing of the line. The system also accommodates for the energy in the ink upon termination of the line.

Before discussing the operation of the system upon line termination, the dynamic pen control during the writing of the lines will be considered. This dynamic pen control is based on direct ink sensing by the pen tip 28 itself, and provides pen tracking of any substrate camber or cross-over contour without the use of a surface sensing 'outrigger' probe at the pen tip. The electro-optical sensor monitors vertical pen tip location and exerts appropriate magnetic feedback forces via the summing amplifier 140 and driver amplifier 142 on the pen tip 28 (See FIG. 2). The feedback system electronically eliminates the spring constant of the pen tip supporting and ink feed structure. It also provides appropriate acceleration assist forces to reduce the inertia of the pen tip. A suitable design may have an operating band width of 200 Hz. With the dynamic pen control activated, the pen tip does not oscillate when the pen force is set to zero. The pen tip floats vertically as though in zero G space, attached to a "rubber" tube support. The magnetic feedback forces which drive the pen tip are derived from a sum of currents representing the terms of a second order differential equation that governs the pen dynamics. These currents are generated in the computer so far as the constant pen force $-F_i$ is concerned. The other currents are generated from the pen height signal d (by amplifiers and differentiating circuits). There is a spring compensation which may be generated by a spring compensation circuit 178 which may be an amplifier. The mass compensation component is generated by a circuit 180 which may include a double differentiating amplifier. The second order differential equation that governs the dynamic pen control is:

$$F_h = kd + KW_N(1/g)\overline{d} - F_i$$

where: $F_h$ is the magnetic lift force; Fi is the lift force from the viscous ink flow which is acting on the pen; $-F_i$ is the pen force in the opposite direction to the lift force); $W_N$ is the weight equivalent of net effective dynamic pen mass: k is the spring constant of the pen support and ink delivery tubes structure 56. K is a lag constant which is less than, but near unity (where 1/(1−K) is the acceleration force gain of the feedback system); g is the gravitational acceleration constant; and d is the vertical pen displacement. Inasmuch as the equilibrium position of the pen is taken at the rest position of the pen and flexural support structure 56 as determined by the weight of the pen and its support and the counter action against this weight of the magnetic attraction of the magnet to the core of the electromagnet, no constant weight term need be considered in the second order differential equation given above.

It will be noted that the first term, kd, produces a force that exactly balances the spring force when the pen is vertically displaced from its equilibrium position. Spring compensation circuitry can compensate for any non-linearity due to the variable magnet gap between the magnet on the pen tip 28 and the electromagnet coil.

The second term in the equation provides the force required for vertical acceleration of the pen tip. This term is only activated when writing over pre-fired lines, since accelerations required for following substrate camber are usually low. This term is effectively a force amplifier term which produces an acceleration force gain identified above.

Oscillation will not occur as long as K is less than unity. The K can only be set by the operator for the amount of acceleration force gain desired. A suitable acceleration range has been found to be plus or minus 2 g. As notes above, without the $F_1$ term activated, the spring term. kd, completely eliminates the spring effect of the pen tip supporting structure. If the pen tip is set into oscillation while the electronics are turned off the oscillation is abruptly stopped when electronics are turned on, the pen tip again floating freely and remaining at any vertical level to which it is pushed. The F, term provides constant, preset downward pen force which remains constant, even when following the vertical contours due to chamber of the substrate surface. Typically, for 4 and 5 mm wide lines, the pen force may vary between 50 and 250 milligrams, depending upon the ink material characteristics.

Returning to FIG. 13 it will be noted that interface controller 38 has a table motion pulse counter 190. The end of the table motion is computed as a function of the line length. The table motion pulses which are provided by the table motor pulse generators 168 and 170 terminate at the end of a line. This is shown in the timing diagram depiction of the table motion pulses. As shown by the curve depicting the table motion in the timing diagram of FIG. 13, actual termination of table motion and actual termination of the line lags the end of the table motion pulses. During this time lag the expansion of the ink must be accommodated in order to maintain uniformity of the line cross-section. This is accomplished by means of a delay circuit 192 and another control signal generator 194. The delay circuit 192 interposes a operator preset delay ($OP_2$) from the termination of the table command pulses until the control signal generator 194 is triggered to produce its control pulse. The duration of this control pulse may also be preset by the operator and is indicated $OP_3$. At the leading edge of the pulse from the control signal generator 194, the ink pump motor controller 36 is reversed by utilizing the pulse as a reverse enable control.

Figure 8:
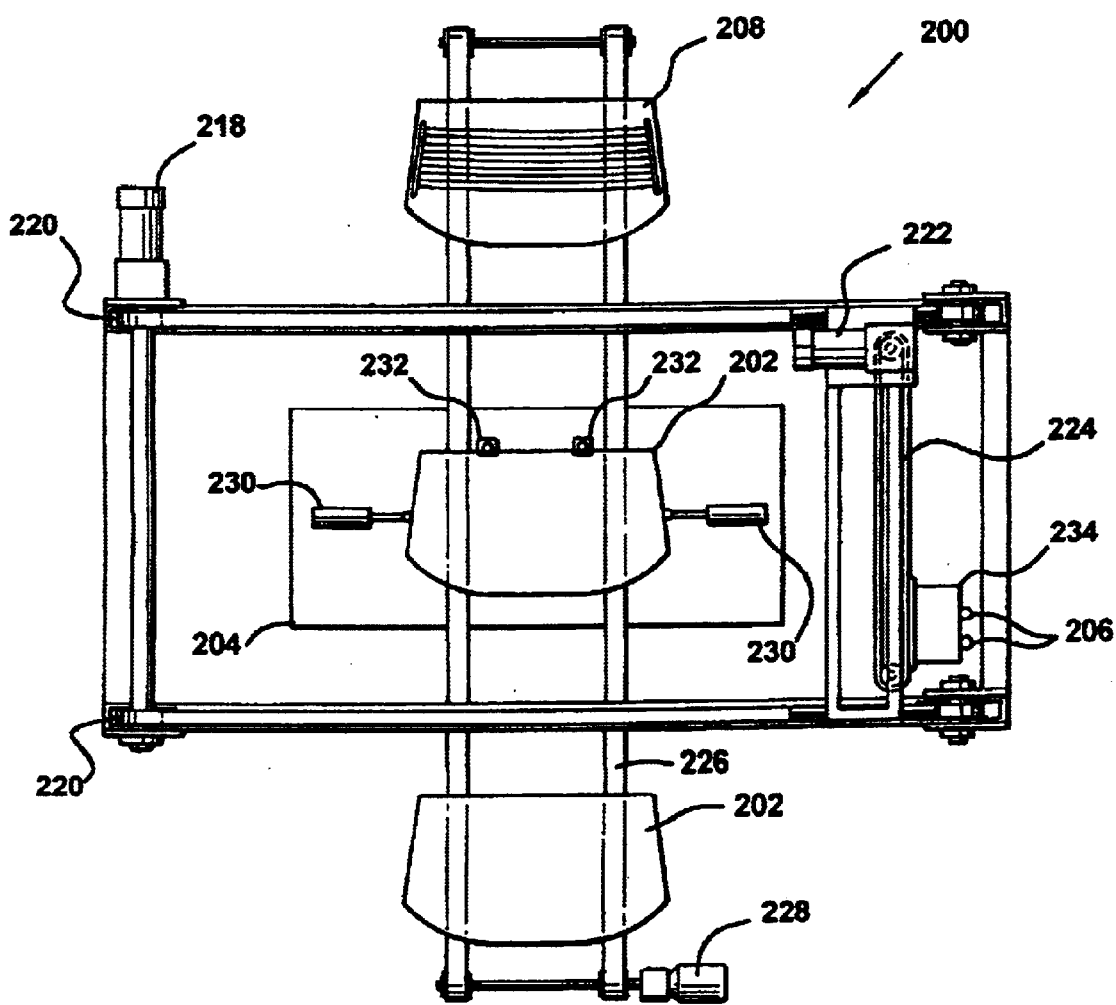
FIG. 8 is a plan view illustrating the inventive method of using the printing system of FIG. 1 to print a representative pattern on a glass or polycarbonate automotive back light.
Figure 9:
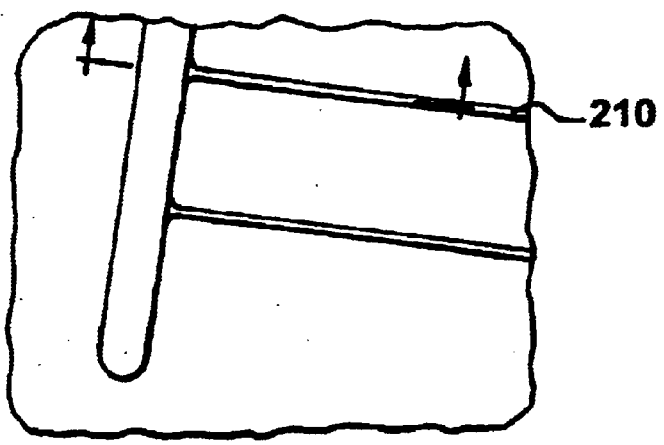
FIGS. 9–12 illustrate various plan views and cross-sections thereof, of different patterns which the system is capable of printing.
Figure 10:
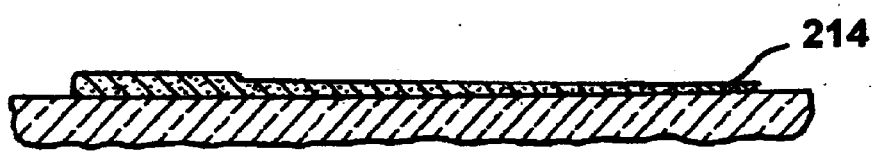
Figure 11:
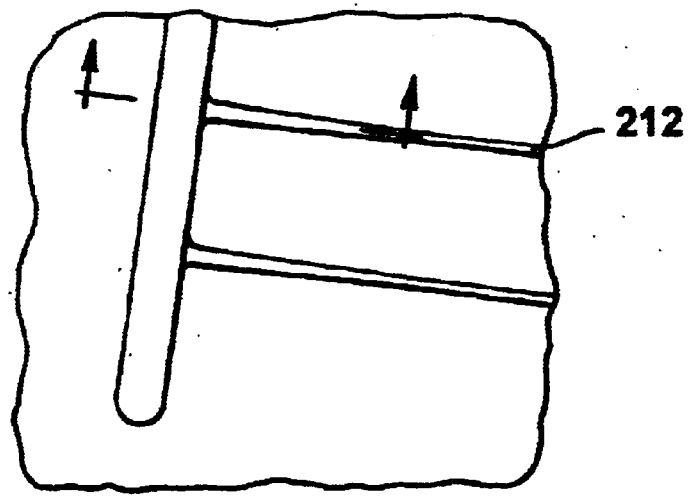
Figure 12:

In order to utilize the previously described writing system to write on a large surface, such as an automotive backlight or the like, the apparatus 200 shown in FIG. 8 has been devised by applicant. It has been discovered that unlike when utilizing such a system for writing on a small electronic circuit board, moving the mass of an automotive backlight or other large glass or plastic substrate, when combined with the speed of movement necessary to attain desired per piece cycle times desired creates a potentially unsafe condition. Therefore, the substrate 202 to be written on will preferably remain stationary once positioned as desired on the x-y table 204, and the pen assembly will be moved relative to the substrate 202.

As inferred by its name, the x-y table 204 is capable of movement in an x and y direction in a horizontal plane. Movement in the x direction is caused by motor 218 and that power is translated by x drive belts 220. Movement in the y direction is caused by motor 222 and that power is translated by y drive belt 224.

A glass substrate 202 to be printed is placed on and moved along a conveyor 226 powered by conveyor motor 228. Once moved over x-y table 204, the substrate 202 is precisely positioned by operation of the x and y positioning stops, 230 and 232, respectively.

Printing system 234 is then moved into position over the substrate 202, and operates as previously described to print the desired pattern.

Figure 3:
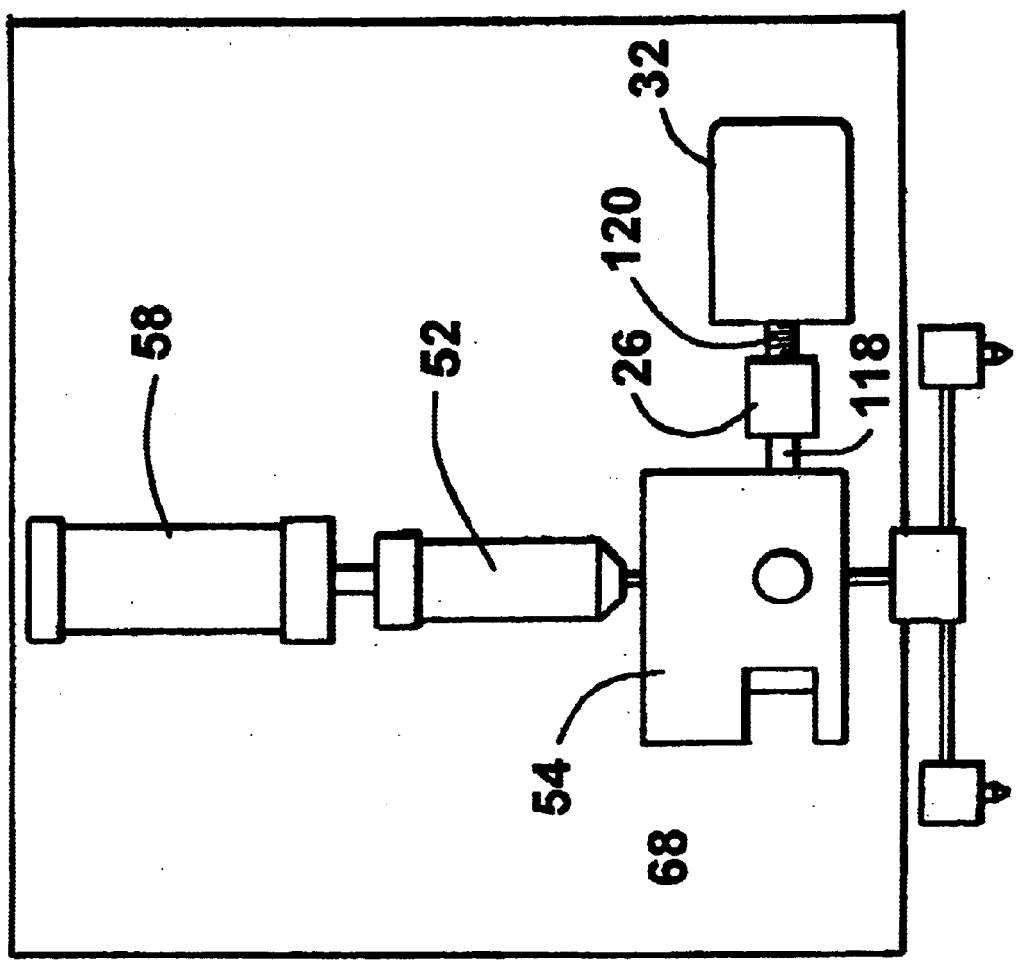
FIGS. 3 and 4 are schematic and isometric views, respectively showing the various aspects of the pen assembly of the system.

In a further preferred embodiment, the writing system utilizes two pen tips 206, simultaneously, to print lines of varying width, thickness, to utilize inks of differing viscosity, etc., during a single pass of the writing system across the substrate 208. This system is illustrated in detail in FIG. 3, and can also be seen in FIG. 8.

The motor 32 (see FIG. 3) turns a drive screw 120 through a preloaded angle bearing set. The rotary motion of the drive screw 120 is converted into linear motion of the pump drive shaft 118 by a driven nut, ball slide arrangement 126.

Types of patterns 210, 212 and cross sections thereof, 214, 216, achievable utilizing the subject writing system are illustrated in FIGS. 9–12, particularly emphasizing the ability of the system to write patterns of variable line width and thickness.

The present invention is very flexible and is capable of a broad range of performance as can be seen from the data contained in Table 1, below, which has been determined through experimentation by applicants. The data contained in Table 1 represent only the minimum and maximum levels of performance achieved for width and thickness of lines printed, utilizing inks of varying viscosity and at varying printing rates, while maintaining the maximum and minimum levels of electrical conductivity noted, based on limited testing of the invention. A large number of other combinations of the parameters within the ranges noted in Table 1 are possible, but have not yet been empirically tested.

TABLE 1

|  | Line Width | Line Thickness | Electrical Conductivity | Printing Rate | Ink Viscosity |
|---|---|---|---|---|---|
| Min. | 0.05 mm | 0.01 mm | 2 milli-ohms/ square | .025 m/sec. | 50,000 pascal seconds |
| Max. | 20 mm | 0.15 mm | 1.0 milli-ohms/ square | 1 m/sec. | 190,000 pascal seconds |

Preferably, utilizing an ink of from 50 k pascal seconds to 190 k pascal seconds, at a printing rate of from 0.025 m/sec to 1 m/sec, a line of from 0.05 mm to 20 mm in width having a uniform thickness of from 0.01 mm to 0.15 mm, and an electrical conductivity of from 1.0 milli-ohms/square to 2.0 milli-ohms/square is achieved utilizing the present invention.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A method for producing a pattern on a glass or polycarbonate substrate comprising:

a) providing a glass or polycarbonate substrate;

b) providing a flexurally supported member having an orifice capable of passing a high viscosity material therethrough;

c) moving said flexurally supported member and said substrate relative to one another; and d) controllably feeding a high viscosity material, said high viscosity material having a viscosity greater than 50,000 pascal seconds, through said orifice at a volume rate synchronous with a rate of movement of said flexural member relative to said substrate, wherein said volume rate of feeding of said high viscosity material through said orifice determines the vertical displacement of said flexurally supported member relative to said substrate.

2. The method of claim 1 wherein the glass or polycarbonate substrate is flat.

3. The method of claim 1 wherein the glass or polycarbonate substrate is curved.

4. The method of claim 1 wherein the glass or polycarbonate substrate is an automotive glazing.

5. The method of claim 1 wherein the highly viscous material applied to said substrate includes an electrically conductive material.

6. The method of claim 1 wherein said flexurally supported member is moved relative to said substrate.

7. The method of claim 1 wherein the pattern formed on said substrate is electrically conductive.

8. The method of claim 1 wherein the electrical conductivity of the pattern formed on said substrate is at least 1 milli-ohm/square.

9. The method of claim 1, further comprising heating said substrate having said pattern thereon so that said pattern is permanently affixed to said substrate.

10. The method of claim 1 wherein the viscosity of said highly viscous material is from 50,000–190,000 pascal seconds.

* * * * *